United States Patent [19]

Tanabe

[11] Patent Number: 4,922,286
[45] Date of Patent: May 1, 1990

[54] COLOR IMAGE RECORDING APPARATUS

[75] Inventor: Kazunori Tanabe, Nagoya, Japan

[73] Assignee: Brother Kogyo Kabushiki Kaisha, Aichi, Japan

[21] Appl. No.: 271,660

[22] Filed: Nov. 16, 1988

[30] Foreign Application Priority Data

Nov. 27, 1987 [JP] Japan ................... 62-301104

[51] Int. Cl.⁵ .......................................... G03B 27/32
[52] U.S. Cl. ..................................... 355/27; 355/212
[58] Field of Search ............... 355/27, 28, 29, 212, 355/20; 226/113, 118, 119

[56] References Cited

U.S. PATENT DOCUMENTS

| 3,650,623 | 3/1972 | Beispel | 355/132 X |
| 4,173,407 | 11/1979 | Kuehnle | 430/31 X |
| 4,399,209 | 8/1983 | Sanders et al. | 420/138 |
| 4,405,227 | 9/1983 | Inoue et al. | 355/27 |
| 4,429,988 | 2/1984 | Okabe | 355/28 |
| 4,440,846 | 4/1984 | Sanders et al. | 430/138 |
| 4,536,463 | 8/1985 | Sanders | 430/138 |
| 4,551,407 | 11/1985 | Sanders et al. | 430/138 |
| 4,622,282 | 11/1986 | Head et al. | 430/138 |
| 4,701,397 | 10/1987 | Rourke et al. | 430/138 |
| 4,777,513 | 10/1988 | Nelson | 355/27 |

FOREIGN PATENT DOCUMENTS

| 0164931 | 12/1985 | European Pat. Off. . |
| 61-77866 | 4/1985 | Japan . |
| 1278325 | 6/1972 | United Kingdom . |
| 2036988 | 10/1979 | United Kingdom . |
| 2113860 | 8/1983 | United Kingdom . |
| 2180075 | 8/1986 | United Kingdom . |

Primary Examiner—L. T. Hix
Assistant Examiner—Khanh Dang
Attorney, Agent, or Firm—Oliff & Berridge

[57] ABSTRACT

A color image recording apparatus capable of simultaneously perform pressure developing operation with respect to one light exposed section of the image recording medium and exposure operation with respect to a following section of the identical image recording medium. A buffer means is disposed between the exposure unit and the pressure developing unit for absorbing a sheet slack which will be generated by reversal feed of the image recording medium. Already light exposed section of the image recording medium initially merely passes through the pressure developing unit without undergoing pressure developing operation. Then, for the pressure developing operation, the light exposed section is reversally travelled toward the exposure unit, to provide the slack. Meanwhile the following section of the recording medium can undergo exposure at the exposure unit.

11 Claims, 1 Drawing Sheet

COLOR IMAGE RECORDING APPARATUS

BACKGROUND OF THE INVENTION

The present invention relates to a color image recording apparatus in which a color image is formed on a photosensitive pressure sensitive image recording medium upon light irradiation thereto through a mask member on which a mask image is carried in accordance with a color image information.

Copending U.S. patent application Ser. No.184,576 filed on Apr. 21, 1988, and copending British Patent application No. 8809700.1 filed on Apr. 25, 1988 disclose a color image recording apparatus using a mask member. According to the apparatus, each of mask images corresponding to trichromatic resoluted images of an original is formed on each of the mask members as an intermediate recording mediums at a monochromatic printer, and such mask member carrring the mask image is brought into intimate contact with an elongated photosensitive pressure sensitive image recording medium at a given position and is subjected to light exposure at an exposure unit. In this case, the irradiated light has a specific light wavelength corresponding to the resoluted color with which the mask member is recorded with the mask image. Upon the exposure, a color latent image is formed on the recording medium. The photosensitive pressure sensitive recording meidum carrying the latent image is then superposed with a separate developer sheet and these are subjected to pressure-developing at pressure developing unit disposed at downstream of the exposure unit, so that a color output image is formed on the developer sheet.

Incidentally, the image recording medium used is so called a transfer type image recording medium described in U.S. Pat. No. 4,399,209. The image recording medium includes a first image recording medium (the above mentioned photosensitive pressure sensitive recording medium) and a second image recording medium (the above mentioned developer sheet), and the first image recording medium is provided with microcapsules which encapsulate therein a first material having first and second phase dependent on light exposure. The developer medium is provided with second material which provides an output image upon reaction with the first material. The light exposed microcapsules are photo-cured, whereas non-exposed microcapsules are ruptured upon pressure application, so that the first material is flowed out of the microcapsules to react with the second material.

According to this apparatus described in the copending application, when the photosensitive pressure-sensitive sheet is moved at a low speed at the time of the pressure development, a following portion of the photosensitive pressure-sensitive sheet which portion is positioned at the exposure unit is also simultaneously moved, since the photosensitive pressure sensitive sheet is of elongated continuous web-like sheet. Further, in order to prevent the developer-coated surface of the developer sheet from being damaged at the time of feeding the developer sheet toward the pressure developing unit, feed rollers are in rotational surface contact with the back surface of the developer sheet (on which the back surface the developer is not coated) during feeding the developer sheet.

According to the above apparatus, however, as mentioned above, since the photosensitive pressure-sensitive sheet part positioned at the exposure unit is also moved at the time of pressure development, it is impossible to conduct a second exposure to light having a second specific wavelength with respect to the following part of the photosensitive pressure sensitive recording medium with using a second intermediate recording medium (a second mask member on which a second resoluted color mask image is formed). Since the pressure developing operation requires relatively long period, the exposure operation to the following photosenstive sheet part is also suspended by this period, thus reducing the entire speed for color image recordation.

Further, since the feed rollers are arranged to rotationally contact the non-coated surface (back surface) of the developer sheet, it is necessary to flip over the developer sheet so that the developer-coated surface (front surface) of the developer sheet contacts the photosensitive pressure-sensitive sheet. This requires a much elongated sheet feeding path for the developer sheet for its turn-over action and may increase the probability of jamming the developer sheet.

SUMMARY OF THE INVENTION

Accordingly, it is an object of this invention to provide a color image recording apparatus capable of simultaneously performing pressure developing operation and exposure operation with respect to a single elongated photosensitive image recording medium.

Another object of this invention is to provide such apparatus which can minimize path length of a developer sheet without its turn-over action.

To attain these objects, according to this invention, there is provided a color image recording apparatus for recording an image corresponding to an original image on an image recording medium, the image recording medium being travelled in a normal feeding direction, the apparatus comprising: exposure unit for exposing to light the image recording medium to form thereon a latent image corresponding to the original image; pressure developing unit disposed at downstream side of the exposure unit for pressure developing the image recording medium; and, buffer means provided between the exposure unit and the pressure developing unit for temporarily absorbing slack of the image recording medium.

According to one specific embodiment of this invention, there is provided a color image recording apparatus for recording an image on an image recording medium with using a mask member on which a mask image is formed based on a color image information, the image recording medium comprising a photosensitive pressure sensitive recording medium and a developer medium, the photosensitive pressure sensitive image recording medium being travelled in a normal feeding direction, the apparatus comprising: exposure unit for exposing to light the photosensitive pressure sensitive recording medium through the mask member in close contact therewith to form a latent image corresponding to the mask image on the photosensitive pressure sensitive recording medium; pressure developing unit disposed at downstream side of the exposure unit for superposing the photosensitive pressure sensitive recording medium with the developer medium and for pressing together; reversal feeding means disposed at downstream of the exposure unit for feeding the photosensitive pressure sensitive recording medium to a direciton opposite the normal feeding direction for pressure developing the photosensitive pressure sensitive recording medium, to thereby form a visible image on the developer medium during the reversal feeding; and buffer means provided between the exposure unit and the pressure developing unit for temporarily absorbing slack of the photosensitive pressure sensitive recording medium, the slack being provided by the reversal feeding of the photosensitive pressure sensitive recording medium.

According to the present color image recording apparatus having the above structure, the light exposed section of the photosensitive pressure sensitive recording medium provisionally passes through the pressure developing unit without undergoing the pressure developing operation. Then, the developer sheet is fed and superposed with the light-exposed section of the photosensitive pressure-sensitive sheet during the reversal feeding of the photosensitive pressure sensitive recording medium. These two sheets one on the other are subjected to pressure development while they are moving in the reversal direction, and the slack of the photosensitive pressure-sensitive sheet is temporarily absorbed by the buffer means during this pressure developing operation. The slack is wound up upon completion of the pressure development. Even during the pressure development, therefore, the following portion of the photosensitive pressure-sensitive sheet which lies at the exposure unit can be held at a position, so that the exposure unit can execute a process for forming latent image of the next color image on the following part of the photosensitive pressure-sensitive sheet.

DETAILED DESCRIPTION OF THE PREFERRED EMBODIMENT

A preferred embodiment according to this invention will be described below with reference to the accompanying drawings.

Figure 1:
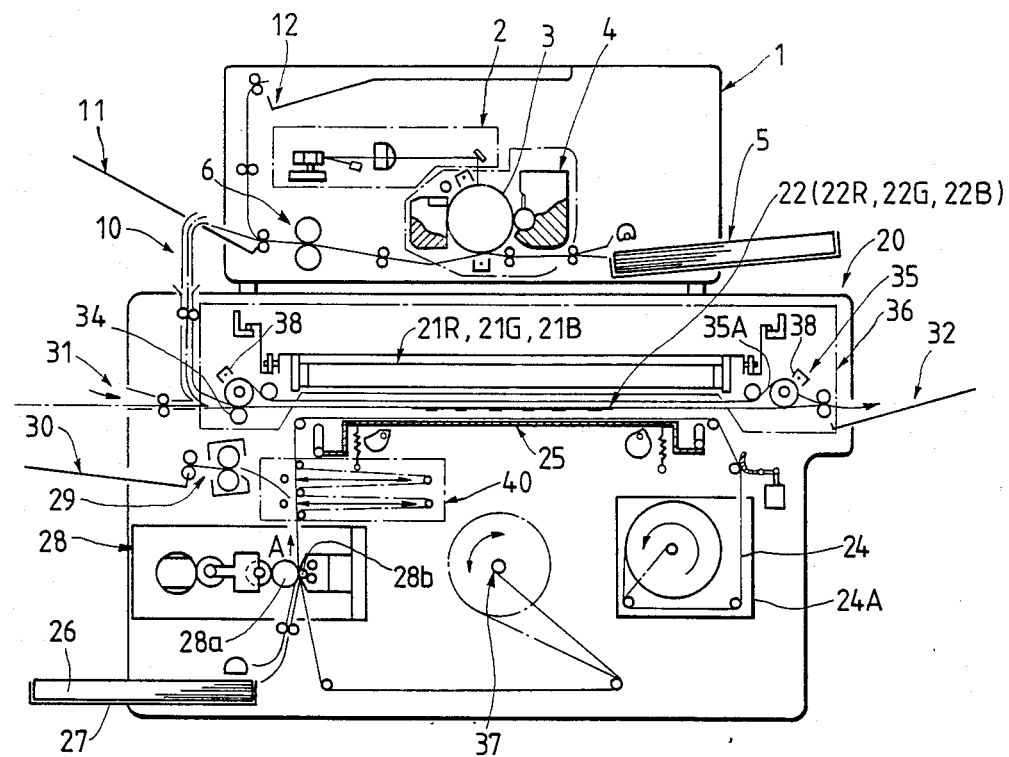
FIG. 1 is a cross-sectional elevation showing a color image recording apparatus according to one embodiment of this invention.

FIG. 1 shows a color image recording apparatus according to this invention coupled with a monochromatic printer. The printer exemplified in FIG. 1 is a monochromatic laser printer 1. Referring first to the laser printer 1, a polygon scanner 2 is disposed above a photosensitive drum 3 electrically chargeable. The scanner 2 irradiates a laser beam on the charged photosensitive drum 3 to form an electrostatic latent image thereon in accordance with an image information or recording data transferred from a host computer (not shown). The drum 3 having the latent image formed thereon is subjected to development by a developing unit 4 where toners are accumulated, so that a toner image is provided over the peripheral surface of the drum 3. The toner image is then transferred to a regular sheet or an OHP (over head projector) sheet fed from a sheet feeding cassette 5. The transferred toner image on the sheet is then fixed by a fixing unit 6. This image fixed sheet serves as an intermediate sheet or a mask member 22 in the image recording apparatus 20 according to this invention.

The color image recording apparatus 20 of this invention uses the mask member 22 which carries a mask image formed on a basis of the color image data supplied from the host computer. However, if an ordinary monochromatic image is intended, the sheet 22 carrying the monochromatic image fixed thereon by the monochromatic laser printer 1 may be fed out on a monochromatic sheet discharging tray 11 or 12.

The color image recording apparatus 20 according to this invention will next be described. The apparatus 20 generally includes a sheet-path change-over unit 10, an exposure unit 36 having an exposure stand 25, light sources 21R, 21G and 21B, a developer sheet cassette 27, a pressure developing unit 28, a thermal fixing unit 29, a discharge tray 30, a manual tray 31, and a buffer means 40. The sheet-path the change-over unit 10 is disposed adjacent the printer 1 for switching a sheet feeding path so as to selectively feed mask member 22R, 22G and 22B (hereinafter also referred to as intermediate sheet 22) from the monochromatic laser printer 1 to the exposure unit 36. The exposure stand 25 extends in horizontal direction and is disposed below the light sources 21R, 21G and 21B. The exposure stand 25 is vertically movable. A photosensitive roll cassette 24A is positioned at lower portion of one end of the stand 25, and a take up means 37 is provided at a lower position of the stand 25. The rolled photosensitive sheet 24 is pulled out of the cassette 24A and taken-up by the take up means 37 through the stand 25.

On the exposure stand 25, the intermediate sheet 22 is set in close contact with a photosensitive pressure-sensitive sheet 24. The light sources 21R, 21G and 21B for three primary colors of red, green and blue which are selectively used for light irradiation to the photosensitive sheet 24 through the mask member 22.

The developer sheet cassette 27 is disposed at a lower portion of the apparatus 20. The cassette 27 accommodates therein developer sheets 26 whose one surface is provided with a developer material which reacts with a first material (chromogenic materials) encapsulated in microcapsules coated on the top surface of the photosensitive pressure-sensitive sheet 24.

The pressure developing unit 28 is disposed downstream of the exposure unit 36 for developing the developer sheet 26 superposed on the photosensitive pressure-sensitive sheet 24. The pressure developing unit 28 includes a pressure roller 28a which allows the already light-exposed part of the photosensitive sheet 24 to move toward a reverse direction (toward the sheet roll cassete 24A) during pressure developing operation. The pressure roller 28a confronts a back-up roller 28b, and relative distance between these rollers 28a and 29b is changeable. The roller 28a serves as reversal drive means for feeding the sheet 24 in reverse direction as shown by an arrow A in FIG. 1.

The thermal fixing unit 29 is adapted for fixing the output image on the developer sheet. The discharge tray 30 is disposed downstream of the fixing unit 29 for receiving the developer sheet 26 on which the output image is provided. The manual tray 31 is disposed at a position adjacent another end of the exposure stand 25 for manually feeding the intermediate sheet into the apparatus 20. The discharge tray 32 is disposed at a position adjacent to the one end of the exposure stand 25 for receiving the intermediate sheet 22. A mask member carrying means 35 is disposed above the stand 25 for transferring the intermediate sheet 22 over the photosensitive sheet 24. More specifically, the carrying means 35 includes an endless belt 35A formed of electrically insulative material such as PET, and a static electricity generators 38 such as a corotoron 38 disposed at end portions of the belt 35A. The endless belt 35A has an static electricity by the generators 38, so that the mask member 22 is electrically sticked or suspended from the belt 35A. Further, a leading edge aligning means such as a roller 34 is disposed at a position adjacent the other end of the stand 25 for position alignment of the leading edge of the mask member 22 supplied from the printer through the sheet path change-over unit 10.

Figure 2:
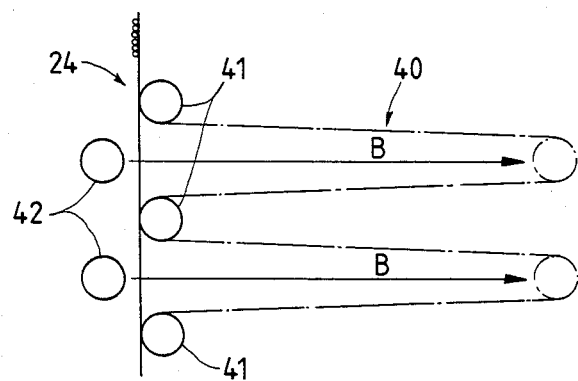
FIG. 2 is a cross-sectional view illustrating a buffer means that is an essential portion of this invention.

The buffer means 40 is disposed between the exposure unit 36 and the pressure developing unit 28 for temporarily absorbing the slack of the following photosensitive pressure-sensitive sheet 24 at the time pressure developing is performed. The buffer means 40, as illustrated in detail in FIG. 2, includes three rotatable fixed rollers 41 and two rotatable movable rollers 42. The fixed rollers 41 are secured at fixed positions at intervals in the vertical direction. These rollers 41 are in rotational contact with one surface (non-coated surface) of the photosensitive pressure-sensitive sheet 24. The two rotatable, movable rollers 42 are positioned opposite with respect to the photosensitive pressure-sensitive sheet 24. Each one of the movable rollers 42 can be movable through a space defined between the neighboring fixed rollers 41 and 41. In the illustrated embodiment, these movable rollers 42 are movable toward a direction shown by an arrow B to provide a meandering path of the sheet 24, to thereby absorb slack of the sheet 24 with contacting the opposite surface of the sheet 24. Apparently, these movable rollers are selectively brought into rotational contact with the microcapsule surface of the sheet 24.

A description will be given below of the operation of the present apparatus in a color mode. In the color mode, the mask member 22R which carries color resoluted red image prepared by the laser printer 1 reaches the leading edge aligning roller 34 and is subjected to position alignment after passing through the path change-over unit 10.

Then the mask member 22R is electrostatically adhered by means of the static electricity generator 38 to the intermediate sheet conveying means 35 and the mask member 22R is conveyed to a given position of the exposure unit 36. The mask member 22R is aligned at the exposure unit 36 in such a way that the color latent image formed on the photosensitive pressure-sensitive sheet 24 is prevented from having a color deviation or slip due to further movement the intermediate sheet conveying means 35.

In the exposure unit 36, upon elevation of the exposure stand 25 the mask member 22R is brought into close contact with the photosensitive pressure-sensitive sheet 24, and the mask member 22R and the sheet 24 are exposed to light by the light source 21R to form the latent image corresponding to the mask member 22R on the sheet 24. After being exposed to light by the light source 21R, the mask member 22R is discharged onto the discharge tray 32. The same operation is executed for the other mask members 22G and 22B while the photosensitive pressure sensitive sheet 24 is maintained at the initial exposure position, and a color latent image would be formed on the identical zone of the photosensitive pressure-sensitive sheet 24.

The photosensitive pressure-sensitive sheet 24 having a color latent image formed thereon in this manner is quickly wound up by the take-up means 37 until the trailing edge of the latent image passes through the pressure developing unit 28. In this state, the two confronting pressure rollers of the pressure developing unit 28 are spaced away from each other so as to allow the sheet zone 24 at which the latent image is formed to be freely traveled therethrough. Further, the movable rollers 42 of the buffer means 40 are also spaced away from the microcapsule-coated surface of the photosensitive pressure-sensitive sheet 24. Thereafter, the developer sheet 26 fed from the cassette 27 is superposed on the latent image forming section of the photosensitive, pressure-sensitive sheet 24 and these sheets are then subjected to development by the pressure developing unit 28 while being moved in the opposite direction (direction of the arrow A). In other words, the developing operation is started from the trailing end of the latent image forming section. The developer sheet 26 can be reached to the pressure developing unit 28 by a minimized path length without its turn-over action because of the reversal travel of the photosensitive pressure sensitive sheet 24 at the time of development. After the development, the developer sheet 26 is fed through the thermal fixing unit 219 and is discharged on the color discharge tray 30.

Apparently, slack of the photosensitive pressure-sensitive sheet 24 will be generated between the pressure developing unit 28 and exposure unit 36 at the time the photosensitive pressure-sensitive sheet 24 is moved in the opposite direction during pressure development by the pressure developing unit 28. However, this slack is absorbed between the movable rollers 42 and fixed rollers 41 by moving the movable rollers 42 of the buffer means 40 in the direction of the arrow B by applying a constant force to these rollers 42 in the same direction B. In other words, a meandering path is newly provided to elongate the sheet path length, to thus absorb sheet slack.

After the pressure development is completed, the photosensitive pressure-sensitive sheet 24 is wound up again by the take-up means 37. At the same time, the movable rollers 42 of the buffer means 40 are also moved away from the microcapsule-coated surface of the sheet 24.

Meanwhile, the following zone of the photosensitive pressure-sensitive sheet 24 in the exposure unit 36 is held at the fixed position even during the above pressure developing operation, since the movement of the photosensitive sheet 24 zone at the pressure developing unit 28 does not affect the following zone at the exposure unit 36. As a result, it is possible to simultaneously perform the developing operation with respect to the latent image forming zone of the sheet 24 and the exposure operation with respect to the following zone thereof by using the mask members.

The monochromatic printer 1 used in the above embodiment is not restricted to the laser printer, but may be of any type such as an LED printer, a liquid crystal printer or thermal printer, as long as it can produce trichromatic resolution mask image. With a desk top type printer in use, this printer may be mounted on the top of the present color image recording apparatus 20 to easily provide a color image. Further, with a large printer in use, it would be impossible to mount such large printer on the apparatus 20. However, the mask images each carrying trichromatic resolution mask images produced by the large printer can be easily introduced into the present apparatus 20 through the manual tray 31, to thus produce a color output image.

According to this invention, as should be understood from the above, buffer means is provided between exposure unit and the pressure developing unit for temporarily absorbing the slack of a photosensitive pressure-sensitive sheet, which slack is generated at the time of pressure development because of the reversal feeding of the sheet. Accordingly, the exposure unit can expose the following zone of the photosensitive pressure-sensitive sheet to light even during the pressure development, thus significantly increasing the color image recording speed or efficiency. In addition, the pressure development is carried out by moving the exposed portion of the photosensitive pressure-sensitive sheet in the direction opposite to the normal sheet moving direction. Therefore, the developer sheet conveying path can be shortened, and as a result, probability of jamming the developer sheet would be lowered.

Furthermore, the present invention is also available for the image recording apparatus in which the above mentioned mask image is not used. In the latter type, light from the light source is reflected at the origial and the reflected light is applied to the photosensitive pressure sensitive image recording medium positioned at the exposure unit to form on the sheet a latent image corresponding to the original.

While the invention has been described with reference to specific embodiment, it would be apparent for those skilled in the art that various changes and modifications can be made therein without departing from the spirit and scope of the invention.

What is claimed is:

1. A color image recording apparatus for recording an image corresponding to an original image on an image recording medium, said image recording medium comprising a photosensitive pressure sensitive image recording medium and a developer medium, said photosensitive pressure sensitive image recording medium traveling in a normal feeding direction, said apparatus comprising:
    exposure unit for exposing to light said photosensitive pressure sensitive image recording medium to form a latent image thereon;
    pressure developing unit disposed at downstream side of said exposure unit for superposing said photosensitive pressure sensitive image recording medium with said developer medium and for pressing together, said pressure developer unit being in inoperative position for pressure development during travel of said photosensitive pressure sensitive image recording medium in said normal feeding direction and being in operative position for pressure developing operation during travel of the photosensitive pressure sensitive image recording medium and the developer medium in a direction opposite said normal feeding direction;
    reversal feeding means disposed downstream of said exposure unit for reversal feeding said photosensitive pressure sensitive image recording medium in the direction opposite said normal feeding direction for pressure developing said photosensitive pressure sensitive image recording medium, to thereby form a visible image on said developer medium during said reversal feeding; and
    buffer means provided between said exposure unit and said pressure developing unit for temporarily absorbing slack of said photosensitive pressure sensitive image recording medium said slack being provided by said reversal feeding of said photosensitive pressure sensitive image recording medium.

2. The color image recording apparatus as defined in claim 1, further comprising a reversal feeding means disposed at said pressure developing unit for feeding said photosensitive pressure sensitive image recording medium already light-exposed by said exposure unit toward a direction opposite to said normal feeding direction during pressure developing operation for said already light-exposed photosensitive pressure sensitive image recording medium.

3. The color image recording apparatus as defined in claim 2, wherein said reversal feeding means comprises a pressure roller of said pressure developing unit, said pressure roller being movable to selectively contact with said photosensitive pressure sensitive image recording medium.

4. The color image recording apparatus as defined in claim 1, wherein said photosensitive pressure sensitive image recording medium is provided with microcapsules, said microcapsules encapsulating therein a first material having a first and second phases dependent on light exposure, and said developer medium is provided with a second material which provides an output image upon reaction with said first material.

5. The color image recording apparatus as defined in claim 4, wherein said original image is carried on a mask member which is prepared based on color image data by trichromatic resolution; and wherein said exposure unit exposes to said light said photosensitive pressure sensitive image recording medium through said mask member in close contact therewith; and wherein said developer medium and said photosensitive pressure sensitive recording medium carrying said latent image are superposed with each other and pressed together at said pressure developing unit to thereby develop a color visible image on said developer medium.

6. The color image recording apparatus as defined in claim 1, wherein said buffer means comprises:
    a plurality of fixed rollers secured at fixed positions and spaced away from each other by a space, said fixed rollers being positioned at one side of said photosensitive pressure sensitive image recording medium; and
    at least one movable roller positioned at another side of said photosensitive pressure sensitive image recording medium; said movable roller being movably provided between said fixed rollers and being passable through said space.

7. The color image recording apparatus as defined in claim 2, wherein said buffer means comprises:
    a plurality of fixed rollers secured at fixed positions and spaced away from each other by a space, said fixed rollers being positioned at one side of said photosensitive pressure sensitive image recording medium; and
    at least one movable roller positioned at another side of said photosensitive pressure sensitive image recording medium; said movable roller being movably provided between said fixed rollers and being passable through said space.

8. The color image recording apparatus as defined in claim 3, wherein said buffer means comprises:
    a plurality of fixed rollers secured at fixed positions and spaced away from each other by a space, said fixed rollers being positioned at one side of said photosensitive pressure sensitive image recording medium; and
    at least one movable roller positioned at another side of said photosensitive pressure sensitive image recording medium; said movable roller being movably provided between said fixed rollers and being passable through said space.

9. The color image recording apparatus as defined in claim 4, wherein said buffer means comprises;
- a plurality of fixed rollers secured at fixed positions and spaced away from each other by a space, said fixed rollers being positioned at one side of said photosensitive pressure sensitive image recording medium; and,
- at least one movable roller positioned at another side of said photosensitive pressure sensitive image recording medium; said movable roller being movably provided between said fixed rollers and being passable through said space.

10. The color image recording apparatus as defined in claim 5, further comprising a sheet path changeover unit disposed at one side of said exposure unit, said sheet path change-over unit selectively feeding said mask member into said exposure unit.

11. A color image recording apparatus for recording an image on an image recording medium with using a mask member on which a mask image is formed based on a color image information, said image recording medium comprising a photosensitive pressure sensitive image recording medium and a developer medium, said photosensitive pressure sensitive image recording medium traveling in a normal feeding direction, said apparatus comprising:

exposure unit for exposing to light said photosensitive pressure sensitive image recording medium through said mask member in close contact therewith to form a latent image corresponding to said mask image on said photosensitive pressure sensitive image recording medium;

pressure developing unit disposed at downstream side of said exposure unit for superposing said photosensitive pressure sensitive image recording medium with said developer medium and for pressure together;

reversal feeding means disposed at downstream of said exposure unit for reversal feeding said photosensitive pressure sensitive image recording medium in a direction opposite said normal feeding direction for pressure developing said photosensitive pressure sensitive image recording medium, to thereby form a visible image on said developer medium during said reversal feeding; and buffer means provided between said exposure unit and said pressure developing unit for temporarily absorbing slack of said photosensitive pressure sensitive image recording medium, said slack being provided by said reversal feeding of said photosensitive pressure sensitive image recording medium.

* * * * *